(12) United States Patent
Gupta et al.

(10) Patent No.: US 11,346,089 B2
(45) Date of Patent: May 31, 2022

(54) FLUID DISPENSING SYSTEM

(71) Applicant: M.I.S. ELECTRONICS INC.

(72) Inventors: Bhusan Gupta, Richmond Hill (CA); Hamid Farzaneh, Richmond Hill (CA); Farhad Pezeshki, Toronto (CA); Saeid Mohmedi, Aurora (CA)

(73) Assignee: M.I.S. Electronics Inc., Richmond Hill (CA)

( * ) Notice: Subject to any disclaimer, the term of this patent is extended or adjusted under 35 U.S.C. 154(b) by 133 days.

(21) Appl. No.: 16/618,332

(22) PCT Filed: Jun. 1, 2018

(86) PCT No.: PCT/CA2018/050659
§ 371 (c)(1),
(2) Date: Nov. 29, 2019

(87) PCT Pub. No.: WO2018/218372
PCT Pub. Date: Dec. 6, 2018

(65) Prior Publication Data
US 2021/0156126 A1 May 27, 2021

Related U.S. Application Data

(60) Provisional application No. 62/513,658, filed on Jun. 1, 2017, provisional application No. 62/513,638, filed on Jun. 1, 2017.

(51) Int. Cl.
*E03C 1/05* (2006.01)
*H01L 35/30* (2006.01)
(52) U.S. Cl.
CPC .............. *E03C 1/057* (2013.01); *H01L 35/30* (2013.01)

(58) Field of Classification Search
CPC .......... E03C 1/057; E03C 1/04; E03C 1/0403; H01L 35/30; H02N 11/00
See application file for complete search history.

(56) References Cited

U.S. PATENT DOCUMENTS 3,356,539 A * 12/1967 Stachurski .............. H01L 35/30
                                                                                136/205
4,159,027 A * 6/1979 Caillet ..................... E03C 1/021
                                                                                138/109

(Continued)

FOREIGN PATENT DOCUMENTS

CN       103904939 A       2/2014
DE       102008021697       7/2011

(Continued)

*Primary Examiner* — Janie M Loeppke
(74) *Attorney, Agent, or Firm* — Elan IP Inc.

(57) ABSTRACT

A fluid dispensing system comprises a first pipe, a second pipe and a thermoelectric generator. The first pipe is configured to carry fluid to the fluid dispensing system. The second pipe is configured to carry fluid to the fluid dispensing system. Temperature of the fluid carried by the first pipe is higher than temperature of the fluid carried by the second pipe. The thermoelectric generator comprises a first side and a second side. The first side of the thermoelectric generator is in thermal contact with the first pipe. The second side of the thermoelectric generator is in thermal contact with the second pipe. Temperature gradient is established between the first side and the second side due to difference in temperature in the first pipe and the second pipe. Electric current is generated by the thermoelectric generator as a result of the temperature gradient.

14 Claims, 7 Drawing Sheets

(56) References Cited

U.S. PATENT DOCUMENTS

| | | | |
|---|---|---|---|
| 4,873,830 A | 10/1989 | Blattler | |
| 5,444,535 A * | 8/1995 | Axelrod | G01N 21/8914 |
| | | | 250/223 B |
| 8,955,822 B2 * | 2/2015 | Parsons | E03D 5/105 |
| | | | 251/129.04 |
| 2004/0041110 A1 | 3/2004 | Kaneko | |
| 2007/0057215 A1 | 3/2007 | Parsons et al. | |
| 2013/0145535 A1 | 6/2013 | Parsons et al. | |
| 2014/0069951 A1 * | 3/2014 | Schmidt | G05B 1/01 |
| | | | 221/13 |
| 2014/0174556 A1 * | 6/2014 | Herbert | E03C 1/057 |
| | | | 137/78.1 |
| 2017/0260722 A1 * | 9/2017 | Horwitz | G01F 15/06 |

FOREIGN PATENT DOCUMENTS

| | | |
|---|---|---|
| DE | 102013100078 | 8/2013 |
| DE | 102013017176 | 4/2015 |

* cited by examiner

FLUID DISPENSING SYSTEM

BACKGROUND

Unless otherwise indicated herein, the materials described in this section are not prior art to the claims in this application and are not admitted to being prior art by inclusion in this section.

FIELD OF THE INVENTION

The subject matter in general relates to automatic water dispensers. More particularly, but not exclusively, the subject matter relates to supplying and managing electrical energy required for operating an automatic water dispenser, including, but not limited to, faucets and showers.

BACKGROUND

Automatic water dispensers that control the flow of water by sensing the presence of an object, typically a hand, close to the water dispenser have been available in the market for many years. Such devices operate without the need to touch the device and provide a more hygienic means for washing hands. The flow of water stops automatically as soon as one removes one's hands away from the device; this feature reduces the amount of water used and is often mandated by local building codes for resource conservation.

Automatic water dispensers use electronic components and circuitry that consume electrical energy. The energy is normally supplied from the building's electrical system via wiring or from batteries. Installing electrical wiring adds complexity because of the presence of electricity and water, which require special considerations. Batteries are gradually drained and must be regularly replaced or recharged, adding cost and inconvenience, and are typically incompatible with high usage areas due to the added cost of replacement or recharging. Battery disposal is also environmentally undesirable.

Another significant disadvantage with depleted batteries is that the automatic water dispenser would stop operating until the batteries are replaced. A similar issue exists with wired water dispensers, namely, if the power is interrupted then the water dispenser is inoperable. Of course, a hybrid system with wiring and batteries can be deployed but the cost is significantly higher.

In view of the foregoing, there is a need for an improved technique for supplying electrical energy required for operating automatic water dispensers.

Apart from the challenges relating to the source of supply of electrical energy for operating automatic water dispensers, there are challenges relating to efficient use of energy while operating automatic water dispensers. Typically, sensing systems provided in automatic water dispensers consume considerable energy.

Faucets based on detecting reflected invisible light, such as infrared sensors, transmit a beam of light and measure the intensity of the reflected light in order to detect the presence of an object in the vicinity of the faucet. This approach required the control system to run a timer at all times and supply power to the infrared transmitter periodically. This process gradually drains the battery or batteries providing power to the control system.

Faucets may be equipped with capacitive sensor, instead of infrared sensor, to detect objects in the vicinity of the faucet. Physical objects including biological material such as humans can be modeled as passive electronic components. An object can be described with 3 distinct values R, L, and C. R being the resistance, L the inductance, and C the capacitance of the object. If two physical objects are placed in close vicinity, the said objects can be described as one capacitor. Changing the distance of the two objects would change the total capacitance of the said capacitor.

In case of an automatic faucet or similar washroom device, the faucet's body together with the built-in electronics and the sink can be modeled as a capacitor with specific capacitance. Once an object such as a human's hand is placed in the vicinity of the faucet, it can be considered as part of the said capacitor, and it changes the total capacitance of the system. If the controller is equipped with a capacitive sensor, the change in the capacitance of the system can be detected and used to trigger an event such as opening an electric valve.

Sanitary devices that utilize a capacitive sensor have a much lower power consumption and hence a longer battery life compared to devices utilizing an infrared sensor. The capacitive sensors are very sensitive to changes in the environment in which they are deployed. Such sensors may become instable through environment humidity, flow of water inside the faucet, electrical and chemical characteristics of water, sink material and other environmental parameters. Achieving a uniform predictable and stable behavior requires special measures during the installation of the device and is almost impossible.

In view of the foregoing, there is a need for improved management of electrical energy required for operating an automatic water dispenser, while ensuring acceptable reliability in detecting objects in the vicinity of the automatic water dispenser.

As discussed earlier, infrared sensors are typically more reliable than capacitive sensors. However, one of the challenges relating to infrared sensors is that the system needs to be calibrated to detect an object at a predefined distance from the infrared sensor. Special software for calibration needs to be developed and integrated in the computing device embedded in the system. At the time of manufacturing and installation, additional steps are required to calibrate the system.

Passive infrared sensors detect the infrared emitted by objects such as human hands and can be used to trigger an actuator such as a solenoid valve. Because an infrared emitting diode is not required as source of infrared light, systems utilizing passive infrared sensor have a much lower power consumption than those measuring the intensity of a reflected infrared beam. Currently available passive infrared sensors are used in motion detectors to detect moving objects at a distance of several meters. In applications such as automatic faucets, the sensor must detect objects in the vicinity of the sensor. The typical range is 5 to 30 centimeters.

In view of the short range, and relatively short desired tolerance, within which objects have to be sensed in the automatic faucets application, there is a need for improved calibration of passive infrared sensors.

SUMMARY

In one aspect, a fluid dispensing system is provided. The system comprises a first pipe and a second pipe. The first pipe and the second pipe are configured to carry fluid to the fluid dispensing system, such that temperature of the fluid carried by the first pipe is higher than temperature of the fluid carried by the second pipe. A thermoelectric generator comprising a first side and a second side is present in the system. The first side of the thermoelectric generator is in thermal contact with the first pipe, and the second side of the thermoelectric generator is in thermal contact with the second pipe. Temperature gradient is established between the first side and the second side due to difference in temperature in the first pipe and the second pipe, and electric current is generated by the thermoelectric generator as a result of the temperature gradient.

In another aspect, a controller of a fluid dispensing system is configured to receive input from a capacitive sensor to identify presence of an object. Upon identification of the presence of the object using the capacitive sensor, the controller turns on an infrared transmitter and monitors a corresponding infrared receiver to ascertain presence of the object within a predefined vicinity of the infrared transmitter. In the event of ascertaining the presence of the object within the predefined vicinity of the infrared transmitter, the controller turns on a valve to allow dispensing of fluid from the fluid dispensing system.

In yet another aspect, a passive infrared sensor is provided. The passive infrared sensor comprises a first polarizing filter and a second polarizing filter. The first polarizing filter and the second polarizing filter are positioned in front of the passive infrared sensor, such that light polarized by the first polarizing filter and the second polarizing filter reach the passive infrared sensor. At least one of the first polarizing filter and the second polarizing filter is configured to be rotated relative to the other to adjust the light reaching the passive infrared sensor, thereby adjusting sensitivity of the passive infrared sensor.

BRIEF DESCRIPTION OF DRAWINGS

Embodiments are illustrated by way of example and not limitation in the figures of the accompanying drawings, in which like references indicate similar elements and in which.

DETAILED DESCRIPTION

The following detailed description includes references to the accompanying drawings, which form a part of the detailed description. The drawings show illustrations in accordance with example embodiments. These example embodiments, which may be herein also referred to as "examples" are described in enough detail to enable those skilled in the art to practice the present subject matter.

However, it may be apparent to one with ordinary skill in the art, that the present invention may be practised without these specific details. In other instances, well-known methods, procedures and components have not been described in detail so as not to unnecessarily obscure aspects of the embodiments. The embodiments can be combined, other embodiments can be utilized, or structural, logical, and design changes can be made without departing from the scope of the claims. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated.

Figure 1:
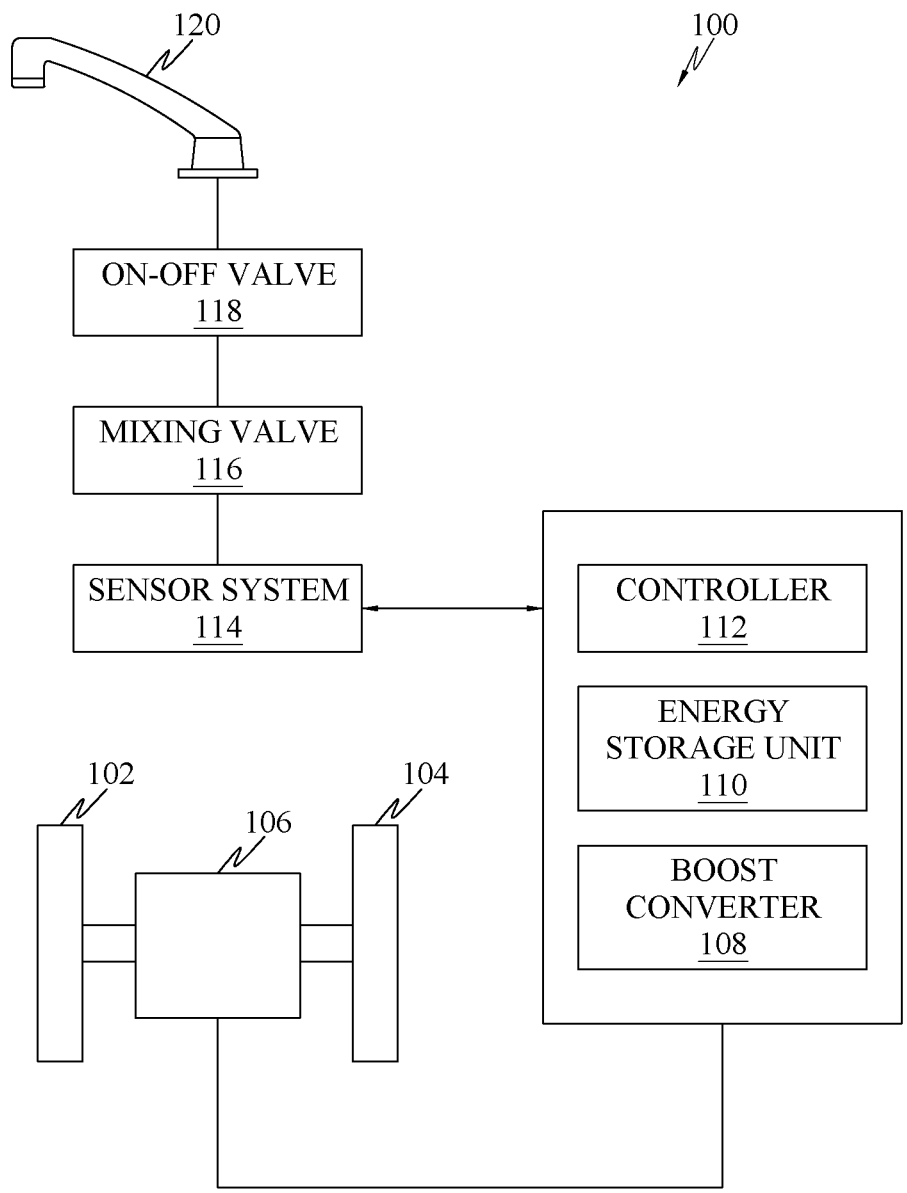
FIG. 1 is a schematic representation of a fluid dispensing system 100, in accordance with an embodiment.

Referring to FIG. 1, a fluid dispensing system 100 is provided for dispensing fluid from a faucet 120. The fluid dispensing system 100 may include a first pipe 102, a second pipe 104, a thermoelectric generator 106, a boost convertor 108, an energy storage unit 110, a controller 112, a sensor system 114, a mixing valve 116, an on-off valve and a faucet 120.

Figures 2A, 2B:
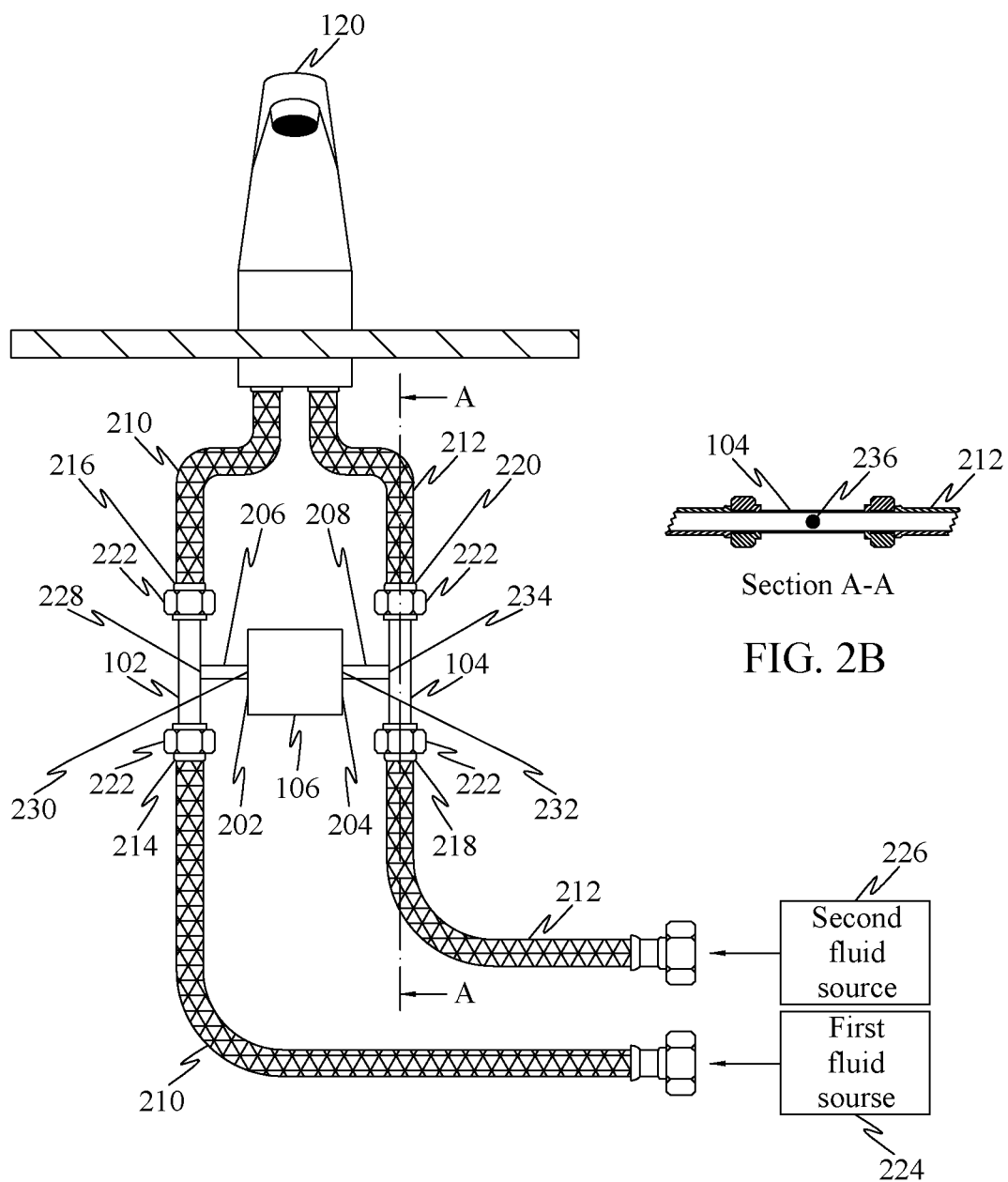
FIG. 2A illustrates a thermoelectric generator 106 engaged to a flexible first hose 210 and a flexible second hose 212, in accordance with an embodiment.
FIG. 2B is a sectional view of a second pipe 104 along an axis A-A (shown in FIG. 2A), in accordance with an embodiment.

Referring now to FIG. 2A, the thermoelectric generator 106 is in contact with a flexible first hose 210 and a flexible second hose 212. The thermoelectric generator 106 may comprise a first side 202 and a second side 204. The first side 202 of the thermoelectric generator 106 may be in direct contact with the first pipe 102 carrying fluid that may be cold. The second side 204 of the thermoelectric generator 106 may be in direct contact with the second pipe 104 carrying fluid that may be hot. In an embodiment, the fluid carried may be water.

In an embodiment, the first pipe 102 may carry fluid that may be hot. The second pipe 104 may carry fluid that may be cold.

In an embodiment, temperature gradient may be established between the first side 202 and the second side 204 of the thermoelectric module 106 due to difference in temperature of the fluids being carried in the first pipe 102 (hot fluid) and the second pipe 104 (cold fluid).

In an embodiment, electric current is generated due to the temperature gradient in the thermoelectric generator 106 (Peltier effect). The electric current thus generated may be transmitted to the boost converter 108 (refer FIG. 1). The boost converter 108 may be configured to modulate voltage of the electric current. In an embodiment, the boost converter 108 may increase the voltage of the electric current that is transmitted from the thermoelectric generator 106.

In an embodiment, the boost converter 108 may transmit the electric current to the energy storage unit 110 (refer FIG. 1) for storage of the electric current. The energy storage unit 110 may be configured to transmit electric current for the functioning of the controller (refer FIG. 1), the sensor system 114 (refer FIG. 1) and other components of the fluid dispensing system 100 that may require electric current to function.

Further, referring to FIG. 2A, the first side 202 of the thermoelectric generator 106 may be in contact with the first pipe 102 through a first thermal transfer component 206 and the second side 204 of the thermoelectric generator 106 may be in contact with the second pipe 104 through a second thermal transfer component 208. The first thermal transfer component 206 and the second thermal transfer component 208 may be extending laterally from the first side 202 and the second side 204 of the thermoelectric generator 106, respectively.

In an embodiment, the first thermal transfer component 206 may comprise a first end 228 and a second end 230. The first end 228 of the first thermal transfer component 206 may be thermally in contact with the first pipe 102 and the second end 230 of the first thermal transfer component 206 may be in thermal contact with the first side 202 of the thermoelectric generator 106.

Likewise, the second thermal transfer component 208 may comprise a first end 234 and a second end 232. The first end 234 of the second thermal transfer component 208 may be thermally in contact with the second pipe 104 and the second end 232 of the second thermal transfer component 208 may be in thermal contact with the second side 204 of the thermoelectric generator 106.

In an embodiment, the first pipe 102 and the second pipe 104 may be operably mechanically attached to the flexible first hose 210 and the flexible second hose 212, respectively. In an embodiment, the flexible first hose 210 and the flexible second hose 212 may be insulated. The flexible first hose 210 and the flexible second hose 212 may be insulated to avoid heat loss of the fluid being carried within the flexible hoses 210, 212. Also, the flexible hoses 210, 212 may be insulated to follow various safety regulations.

In an embodiment, the flexible first hose 210 may receive hot water from a first fluid source 224 and the flexible second hose 212 may receive cold water from a second fluid source 226.

In an embodiment, the mechanical attachment used to connect the first pipe 102 and the second pipe 104 to the flexible first hose 210 and the flexible second hose 212, respectively, may be pipe fittings, dielectric unions, or any other equivalent mechanical fittings 222.

In an embodiment, the first pipe 102 comprises an inlet 214 and an outlet 216. The inlet 214 of the first pipe 102 is connected to one end of the primary flexible first hose 210, wherein other end of the primary flexible first hose 210 is connected to the first fluid source 224. The outlet 216 of the first pipe 102 is connected to one end of the secondary flexible first hose 210, wherein other end of the secondary flexible first hose 210 is connected to the faucet 120 or mixing valve 116.

Likewise, the second pipe 104 comprises an inlet 218 and an outlet 220. The inlet 218 of the second pipe 104 is connected to one end of the primary flexible second hose 212, wherein other end of the primary flexible second hose 212 is connected to the second fluid source 226. The outlet 220 of the second pipe 104 is connected to one end of the secondary flexible second hose 212, wherein other end of the secondary flexible second hose 212 is connected to the faucet 120 or mixing valve 116. In the instant embodiment, the first pipe 102 and the second pipe 104 may not be insulated.

Referring to FIG. 2B, in an embodiment, the first thermal transfer component 206 and the second thermal transfer component 208 are solid cylinders. The first end 228 of the first thermal transfer component 206 may be directly physically exposed to the fluid in the first pipe 102. Similarly, the first end 234 of the second thermal transfer component 208 may be directly physically exposed to the fluid in the second pipe 104. The exposure may be such that, a surface 236 of the second thermal transfer component 208 may be in direct contact with the fluid flowing through the second pipe 104. Similarly, a surface (not shown) of the first thermal transfer component 206 may be in direct contact with the fluid flowing through the first pipe 102.

The advantage the instant embodiment has over an embodiment wherein the first thermal transfer component 206 and the second thermal transfer component 208 are merely in contact with the first pipe 102 and the second pipe 104, respectively, is that the thermal transfer components 206, 208 are in direct contact with the fluid flowing through the pipes 102, 104. This may result in the thermal transfer components 206, 208 conducting heat more efficiently and effectively to the thermoelectric generator 106.

Figure 3:
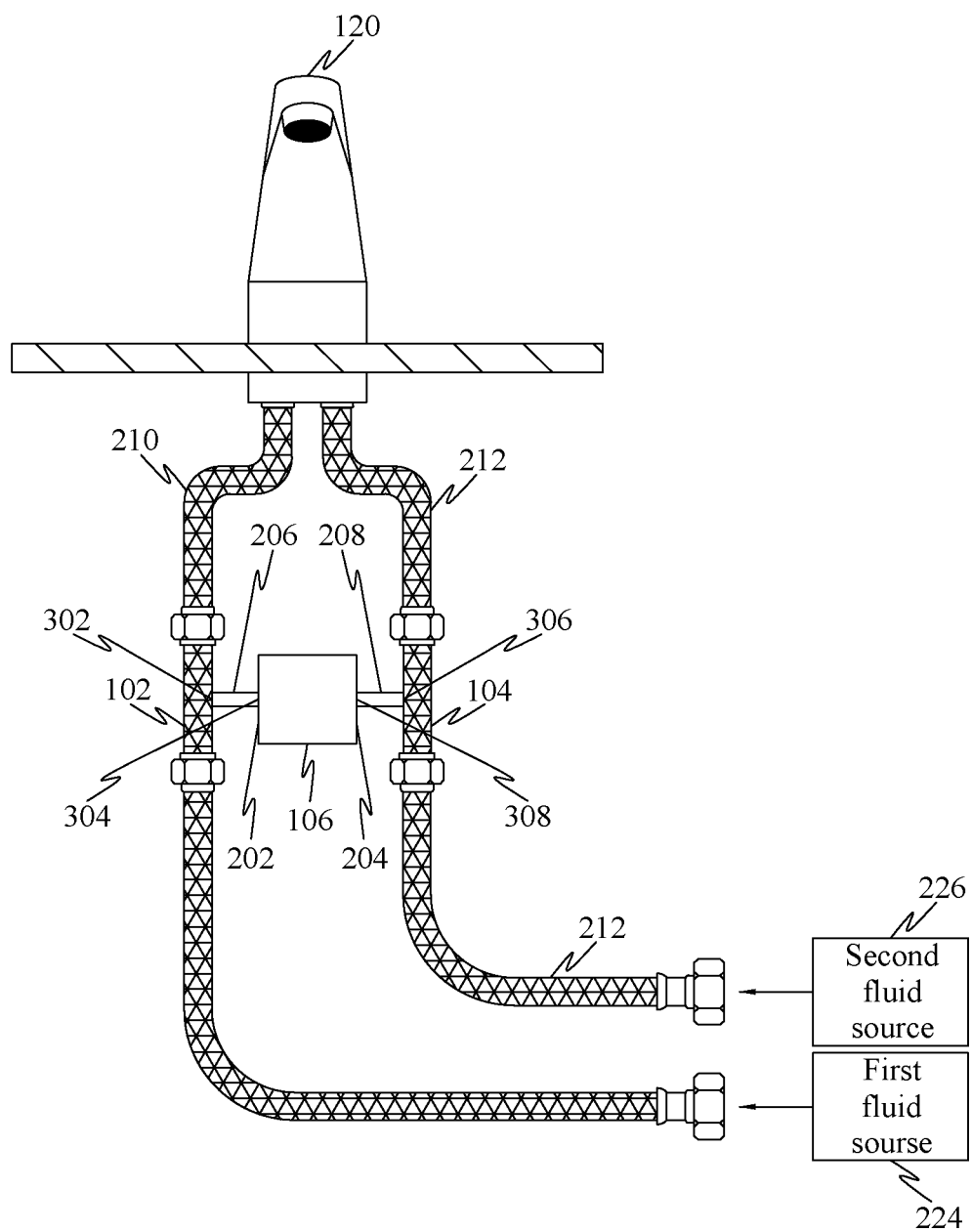
FIG. 3 illustrates the thermoelectric generator 106 with an insulated first pipe 102 and an insulated second pipe 104, in accordance with an embodiment.

Referring to FIG. 3, the thermoelectric generator 106 is provided with an insulated first pipe 102 and insulated second pipe 104. At least a part of the first pipe 102 and the second pipe 104 are insulated and another part is uninsulated. The uninsulated part of the first pipe 102 and the second pipe 104 are in contact with the first thermal transfer component 206 and second thermal transfer component 208, respectively. In an embodiment, the thermal transfer components 206, 208 too may be insulated (not shown) with the ends 228, 230, 232, 234 being left uninsulated where the thermal transfer components 206, 208 connect the sides 202, 204 of the thermoelectric generator 106 and the pipes 102, 104. The insulation of the pipes 102, 104 and the thermal transfer components 206, 208 may reduce radiation of the heat and improve heat conduction.

Figure 4:
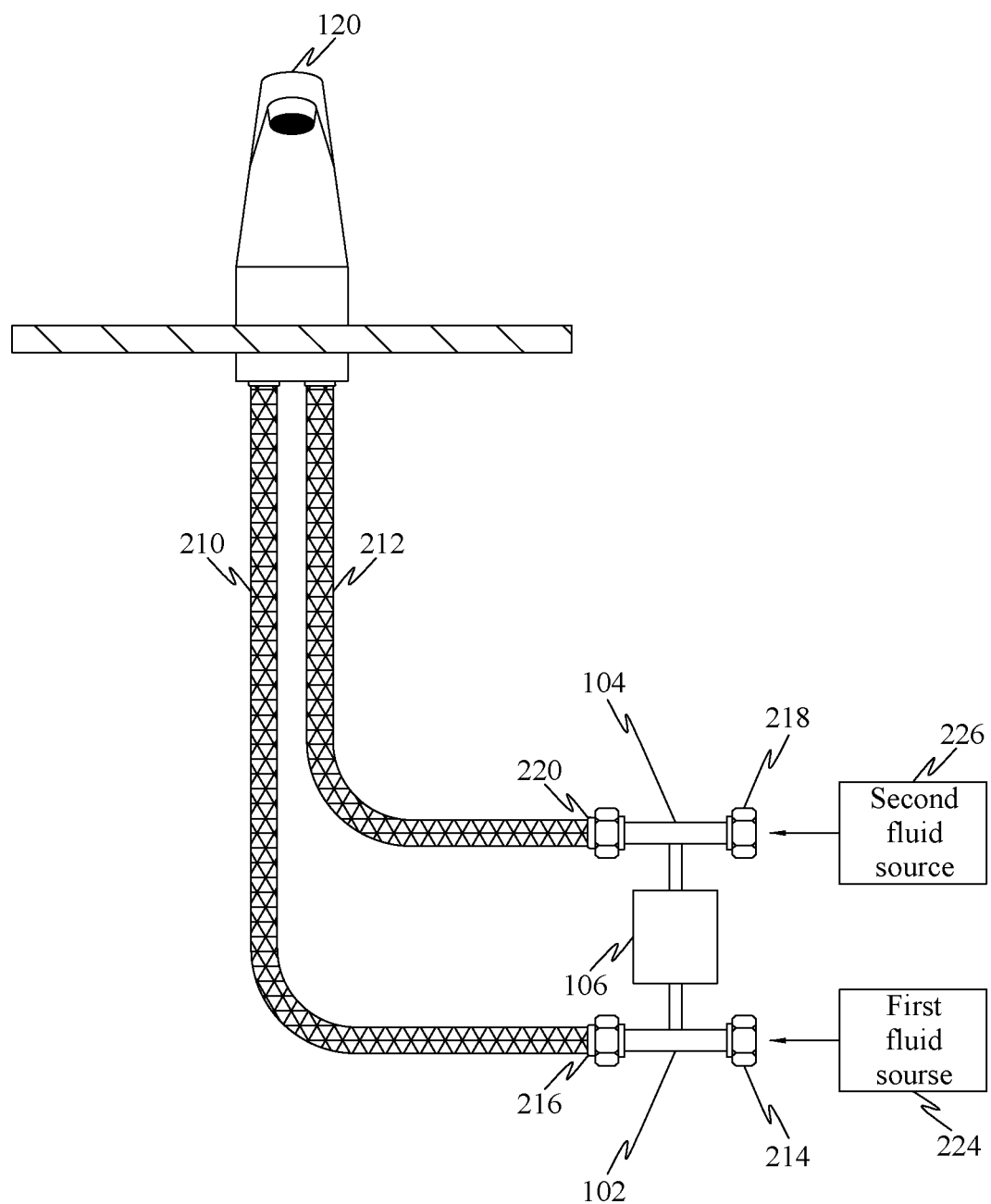
FIG. 4 is an alternate embodiment of thermoelectric generator 106.

FIG. 4 is an alternate embodiment of thermoelectric generator 106, first pipe 102 and the second pipe 104. In the instant embodiment, the inlets 214, 218 of the pipes 102, 104 may be directly attached to the fluid sources 224, 226, respectively. The outlets 216, 220 of the pipes 102, 104 may be attached to the flexible hoses 210, 212, respectively. The advantage of the instant embodiment over the previous embodiments, is that the flexible hoses 210, 212 need not be cut into two to fix the pipes 102, 104. The instant embodiment is advantageous in attaching the system 100 to existing faucet arrangements by detaching the hoses 210, 212 from the fluid sources 224, 226 and attaching the inlets 214, 218 of the pipes 102, 104 to the sources 224, 226 and attaching the outlets 216, 220 of the pipes 102, 104 to the hoses 210, 212.

Figure 5:
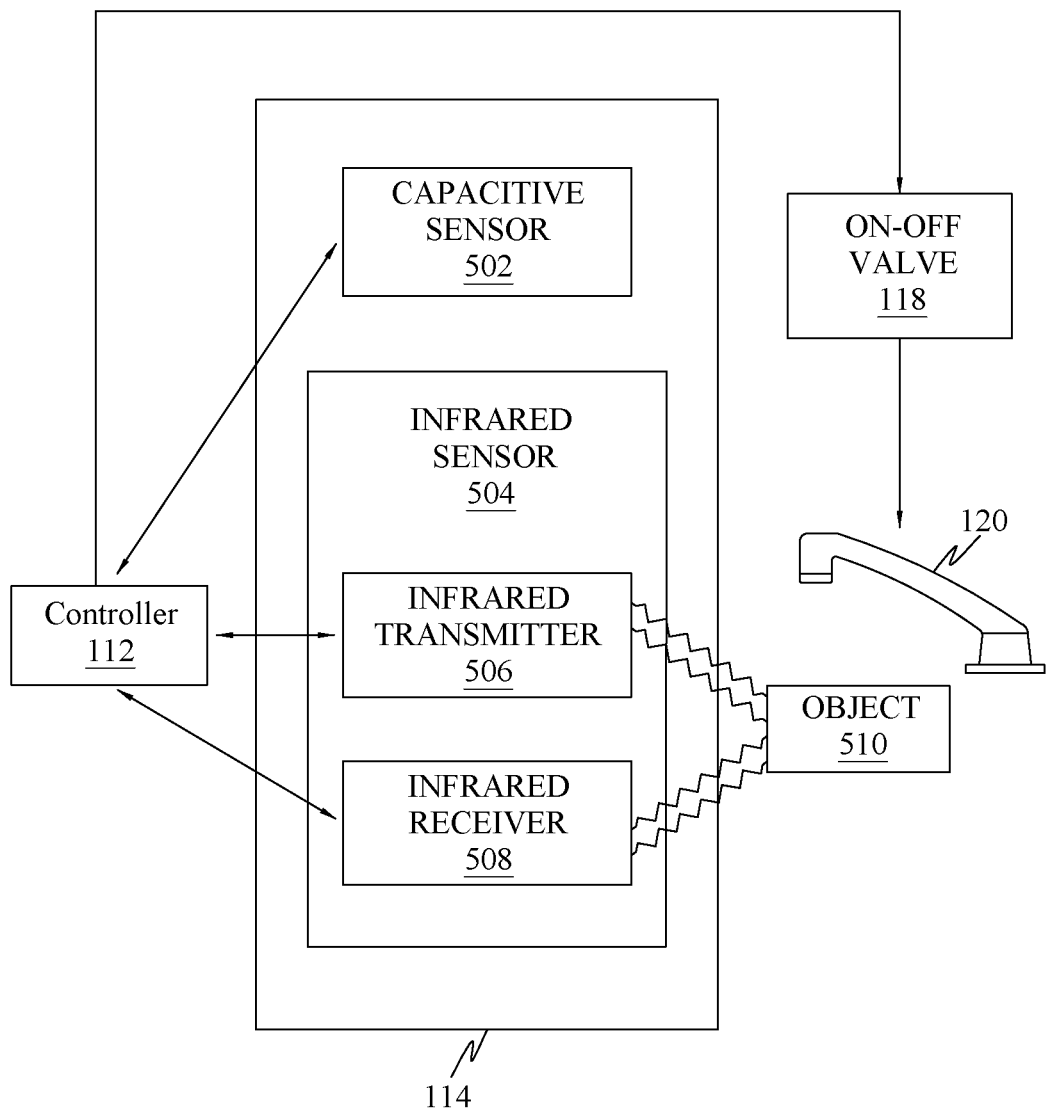
FIG. 5 is a schematic representation of a sensor system 114, in accordance with an embodiment.

FIG. 5 is a schematic representation of the sensor system 114, in accordance with an embodiment. The sensor system 114 may include a capacitive sensor 502, an infrared sensor 504, wherein the infrared sensor 504 may comprise an infrared transmitter 506 and an infrared receiver 508. The sensor system 114 may be in contact with the controller 112. The controller 112 may be connected to the on-off valve 118, which in turn may be in contact with the faucet 120.

Figure 6:
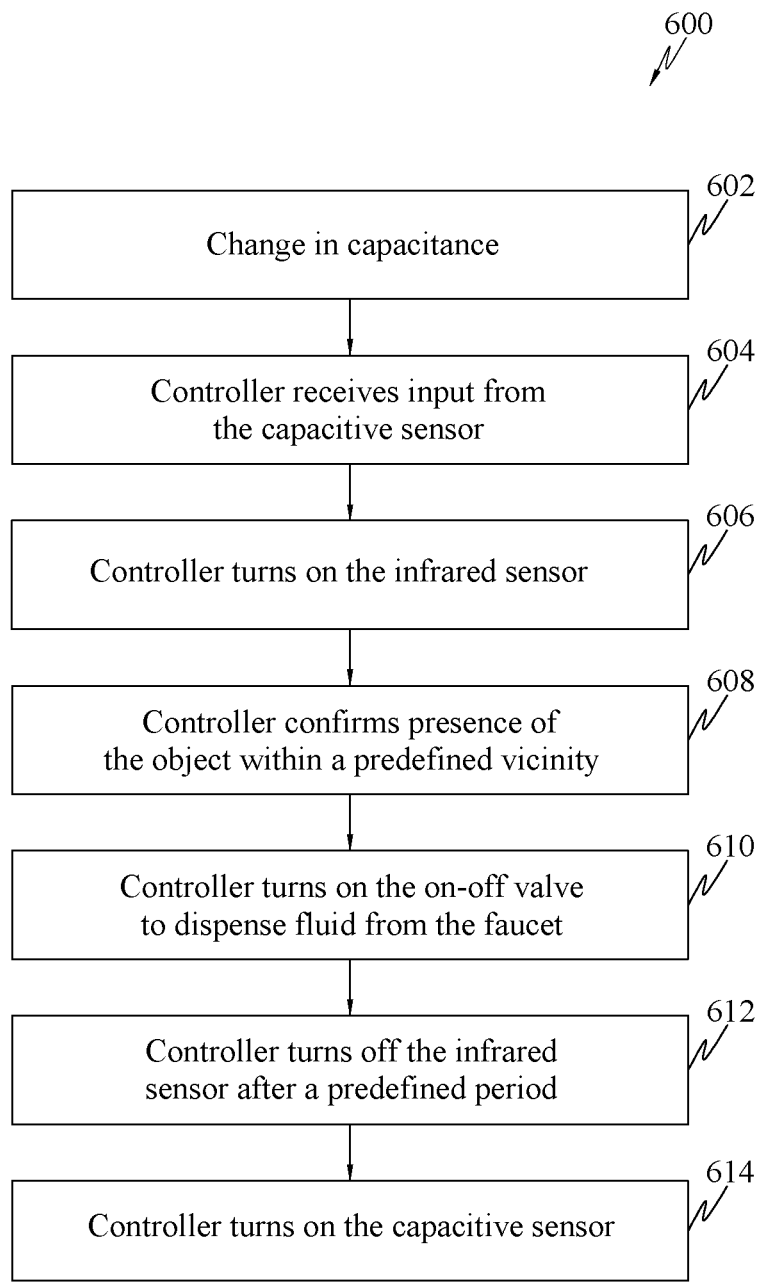
FIG. 6 is a flowchart of an exemplary method 600 of working of the sensor system 114, in accordance with an embodiment.

FIG. 6 is a flowchart of an exemplary method 600 of working of the sensor system 114, in accordance with an embodiment. At step 602, referring to FIG. 5, when an object 510 is in the vicinity of the capacitive sensor 502 and thereby the faucet 120, there is change in capacitance. The controller 112 receives input corresponding to the change in capacitance from the capacitive sensor 502 (step 604, also refer FIG. 5).

At step 606, the controller 112 turns on the infrared sensor 504. At step 608, the infrared sensor 504 emits infrared light waves using the infrared transmitter 506. The controller 112 monitors the infrared receiver 508 to determine the presence of the object 510 within a predefined vicinity of the infrared transmitter 506. The same may be communicated to the controller 112.

At step 610, the controller 112 upon confirming the presence of the object 510 within the predefined vicinity of the infrared transmitter 506, turns on the on-off valve 118 to dispense fluid from the faucet 120.

At step 612, the controller 112 turns off the infrared sensor 504 after a predefined period if there is no detection of the object 510 within the predefined vicinity.

At step 614, the controller 112 turns on the capacitive sensor 502 to continue monitoring the presence of the object 510.

Figure 7:
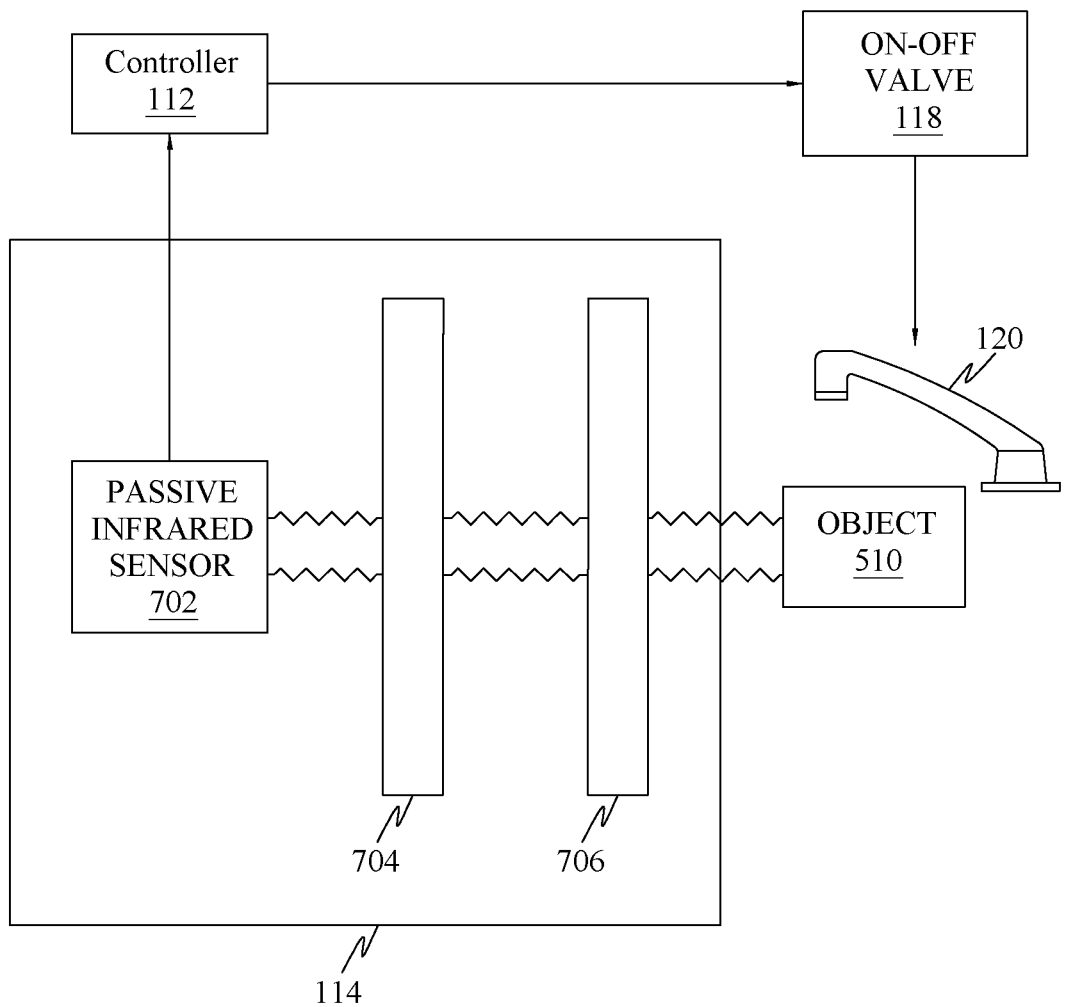
FIG. 7 is a schematic representation of an alternate embodiment of the sensor system 114.

FIG. 7 is a schematic representation of an alternate embodiment of the sensor system 114. The sensor system 114 may include a passive infrared sensor 702, a first polarizing filter 704 and a second polarizing filter 706. The sensor system 114 may be in contact with the controller 112. The controller 112 may be connected to the on-off valve 118, which in turn may be connected to the faucet 120.

The first polarizing filter 704 and the second polarizing filter 706 may be positioned in front of the passive infrared sensor 702. The polarizing filters 704, 706 lets light waves of a specific polarization pass and blocks light waves of other polarizations. Polarizing filters 704, 706 convert a beam of light of undefined or mixed polarization into a beam of well-defined polarization, that is polarized light.

In an embodiment, one of the two polarizing filters 704, 706 may be configured to be rotatably adjustable with respect to the other. This configuration of the polarizing filters 704, 706 helps in adjusting the light reaching the passive infrared sensor. This helps in adjusting the sensitivity of the passive infrared sensor 702.

In an embodiment, the passive infrared sensor 702 receives infrared waves from the object 510, when the object 510 is within a predefined distance from the passive infrared sensor 702. The infrared waves may pass through the polarizing filters 704, 706 and reach the passive infrared sensor 702.

The passive infrared sensor 702 may communicate the presence of the object 510 to the controller 112. The controller 112 may turn on the on-off valve 118 to dispense fluid from the faucet 120.

It shall be noted that the processes described above are described as sequence of steps; this was done solely for the sake of illustration. Accordingly, it is contemplated that some steps may be added, some steps may be omitted, the order of the steps may be re-arranged, or some steps may be performed simultaneously.

Although embodiments have been described with reference to specific example embodiments, it will be evident that various modifications and changes may be made to these embodiments without departing from the broader spirit and scope of the system and method described herein. Accordingly, the specification and drawings are to be regarded in an illustrative rather than a restrictive sense.

Many alterations and modifications of the present invention will no doubt become apparent to a person of ordinary skill in the art after having read the foregoing description. It is to be understood that the phraseology or terminology employed herein is for the purpose of description and not of limitation. It is to be understood that the description above contains many specifications; these should not be construed as limiting the scope of the invention but as merely providing illustrations of some of the personally preferred embodiments of this invention. Thus, the scope of the invention should be determined by the appended claims and their legal equivalents rather than by the examples given.

What is claimed is:

1. A fluid dispensing system comprising:
    a first pipe configured to carry fluid to the fluid dispensing system;
    a second pipe configured to carry fluid to the fluid dispensing system, wherein temperature of the fluid carried by the first pipe is higher than temperature of the fluid carried by the second pipe;
    a thermoelectric generator comprising a first side and a second side, wherein,
        the first side of the thermoelectric generator is in thermal contact with the first pipe;
        the second side of the thermoelectric generator is in thermal contact with the second pipe;
        temperature gradient is established between the first side and the second side due to difference in temperature in the first pipe and the second pipe; and
        electric current is generated by the thermoelectric generator as a result of the temperature gradient;
    wherein,
    the first pipe is operably mechanically connected to a flexible first hose; and
    the second pipe is operably mechanically connected to a flexible second hose; and,
    the first hose is connected to the inlet and the outlet of the first pipe such that the fluid enters the first pipe from the first hose at the inlet of the first pipe and the fluid leaves the first pipe into the first hose through the outlet of the first pipe; and
    the second hose is connected to the inlet and the outlet of the second pipe such that the fluid enters the second pipe from the second hose at the inlet of the second pipe and the fluid leaves the second pipe into the second hose through the outlet of the second pipe.

2. The system of claim 1, wherein the thermoelectric generator comprises a first thermal transfer component and a second thermal transfer component, wherein,
    the first thermal transfer component physically connects the first side of the thermoelectric generator to the first pipe; and
    the second thermal transfer component physically connects the second side of the thermoelectric generator to the second pipe.

3. The system of claim 2, wherein the first thermal transfer component and the second thermal transfer component laterally extend from the thermoelectric generator.

4. The system of claim 2, wherein,
    the first thermal transfer component comprises a first end and a second end;
    the second thermal transfer component comprises a first end and a second end;
    the first end of the first thermal transfer component is directly physically exposed to the fluid in the first pipe, wherein a surface of the first end of the first thermal transfer component is exposed to the fluid in the first pipe; and
    the first end of the second thermal transfer component is directly physically exposed to the fluid in the first pipe, wherein a surface of the first end of the second thermal transfer component is exposed to the fluid in the second pipe.

5. The system of claim 4, wherein,
    the second end of the first thermal transfer component is in contact with the first side of the thermoelectric generator; and
    the second end of the second thermal transfer component is in contact with the second side of the thermoelectric generator.

6. The system of claim 1, wherein the first hose and the second hose are insulated.

7. The system of claim 1, wherein each of the first pipe and the second pipe comprises an inlet and an outlet, wherein,
- the inlet of the first pipe is operably mechanically connected to a first source from which the first pipe receives the fluid;
- the outlet of the first pipe is operably mechanically connected to the first hose into which the fluid is passed from the first pipe;
- the inlet of the second pipe is operably mechanically connected to a second source from which the second pipe receives the fluid; and
- the outlet of the second pipe is operably mechanically connected to the second hose into which the fluid is passed from the second pipe.

8. The system of claim 1, further comprising a first thermal transfer component and a second thermal transfer component, wherein,
- the first thermal transfer component physically connects the first side of the thermoelectric generator to the first pipe;
- the second thermal transfer component physically connects the second side of the thermoelectric generator to the second pipe;
- at least a part of the first pipe is insulated and at least another part of the first pipe is uninsulated;
- the first thermal transfer component is physically connected to the another part of the first pipe, which is uninsulated;
- at least a part of the second pipe is insulated and at least another part of the second pipe is uninsulated; and
- the second thermal transfer component is physically connected to the another part of the second pipe, which is uninsulated.

9. The system of claim 1, further comprising a boost converter, wherein,
- the electric current generated by the thermoelectric generator is transmitted to the boost converter; and
- the boost converter modulates voltage of the electric current.

10. The system of claim 9, further comprising an energy storage unit, wherein,
- energy storage unit receives electric current from the boost converter and stores electric energy.

11. The system of claim 1, wherein the fluid dispensing system comprises a faucet for dispensing fluid.

12. The system of claim 1, further comprising a controller configured to,
- receive input from a capacitive sensor to identify presence of an object;
- turn on an infrared transmitter and monitor a corresponding infrared receiver to ascertain presence of at least a part of the object within a predefined vicinity of the infrared transmitter, only upon identification, using the capacitive sensor, of the presence of the object; and
- turn on an on-off valve to allow dispensing of fluid from the fluid dispensing system.

13. The system of claim 12, wherein the controller is further configured to:
- turn off the infrared transmitter and the infrared receiver after a predefine period in the absence of detection of any object within the predefined vicinity; and
- allow capacitive sensor to continue monitoring to detect presence of any object, even when the infrared transmitter and the infrared receiver are turned off.

14. The system of claim 1, further comprising a passive infrared sensor, and at least a first polarizing filter and a second polarizing filter, wherein,
- the first polarizing filter and the second polarizing filter are positioned in front of the passive infrared sensor, such that light polarized by the first polarizing filter and the second polarizing filter reach the passive infrared sensor;
- at least one of the first polarizing filter and the second polarizing filter is configured to be rotatably adjustable relative to the other to adjust the light reaching the passive infrared sensor, thereby adjusting sensitivity of the passive infrared sensor.

* * * * *